United States Patent

[19]

Oda et al.

[11] Patent Number: 5,950,098
[45] Date of Patent: Sep. 7, 1999

[54] MANUFACTURING METHOD OF A SEMICONDUCTOR DEVICE WITH A SILICIDE LAYER

[75] Inventors: Hidekazu Oda; Takashi Kuroi, both of Hyogo, Japan

[73] Assignee: Mitsubishi Denki Kabushiki Kaisha, Tokyo, Japan

[21] Appl. No.: 08/911,979

[22] Filed: Aug. 15, 1997

Related U.S. Application Data

[62] Division of application No. 08/550,939, Oct. 31, 1995, Pat. No. 5,710,438.

[30] Foreign Application Priority Data

Jun. 26, 1995 [JP] Japan .................................. 7-159443

[51] Int. Cl.$^6$ ................................................. H01L 21/425
[52] U.S. Cl. ......................... 438/527; 438/528; 438/655; 438/682
[58] Field of Search ..................... 438/527, 528, 438/580, 581, 582, 583, 630, 649, 651, 655, 658, 659, 664, 682, 755

[56] References Cited

U.S. PATENT DOCUMENTS

| 4,640,004 | 2/1987 | Thomas et al. . |
|---|---|---|
| 4,793,896 | 12/1988 | Douglas . |
| 4,829,363 | 5/1989 | Thomas et al. . |

*Primary Examiner*—John F. Niebling
*Assistant Examiner*—Christopher Lattin
*Attorney, Agent, or Firm*—Oblon, Spivak, McClelland, Maier & Neustadt, P.C.

[57] ABSTRACT

To form a silicide layer excellent in flatness, uniform in film thickness, and less in junction leak, by destroying the natural oxide film which adversely affects a formation of silicide layer of cobalt or nickel. A cobalt layer (7) is formed in a film thickness of 20 nm or less on an electrode layer (4A) of a gate electrode (4) and on source/drain diffusion layers (1, 2), and a nitrogen (8) is injected by the ion implantation at a density of about $1E15/cm^3$ with an injection energy of 10 keV or more. At this time, the nitrogens (8) destroy the natural oxide film existing in the interface of the cobalt layer (7) and electrode layer (4A), and in the interface of the cobalt layer (7) and the source/drain diffusion layers (1, 2), and distribute deeply into the electrode layer (4A) and the source/drain diffusion layers (1, 2). Later, by a silicide forming reaction of cobalt, a silicide layer (6) is formed. Since the natural oxide film does not exist, the silicide forming reaction proceeds uniformly. Instead of the nitrogen (8), fluorine or silicon may be also used.

6 Claims, 11 Drawing Sheets

$D1 \fallingdotseq 1E22/cm^3$ $D2 \fallingdotseq 1E20/cm^3$

MANUFACTURING METHOD OF A SEMICONDUCTOR DEVICE WITH A SILICIDE LAYER

This is a div. of Ser. No. 08/550,939 filed Oct. 31, 1995, now U.S. Pat. No. 5,710,438.

BACKGROUND OF THE INVENTION

1. Field of the Invention

The present invention relates to a semiconductor device such as a MOS field effect transistor having salicide layers or silicide layers and its manufacturing method.

2. Description of the Background Art

The semiconductor device represented by a SRAM and a DRAM has been recently advanced in integration, and multiple elements are mounted on one chip. Of these elements, transistors are mostly metal oxide silicon field effect transistors or MOSFETs, in particular. The MOSFETs are classified into the nMOSFET (negative MOSFET) in which electrons flow, and the pMOSFET (positive MOSFET) in which holes flow, and they differ in electric polarity, and a circuit is composed by a combination of the nMOSFET and the pMOSFET.

Figure 18:
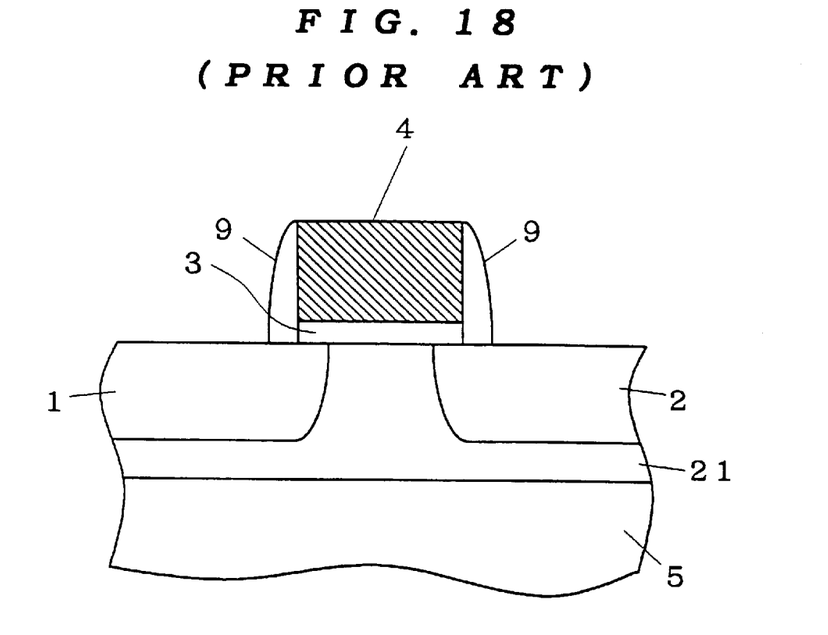
FIG. 18 is a sectional view showing a structure of a conventional MOSFET transistor.
Figure 19:
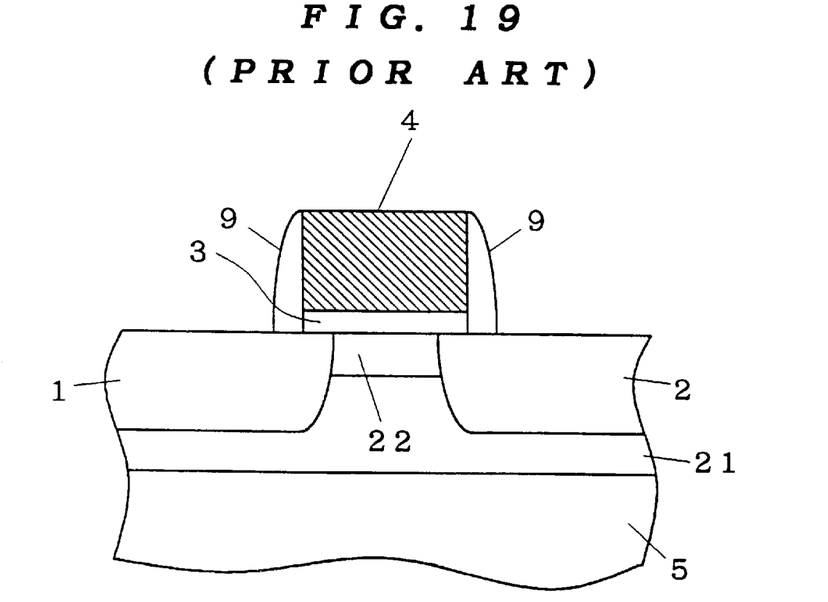
FIG. 19 is a sectional view showing a structure of a conventional MOSFET transistor.

The field effect transistors are structurally classified into the surface channel type shown in FIG. 18 and the buried channel type shown in FIG. 19, and usually since the same gate electrode material is used in both the nMOSFET and the pMOSFET, the surface channel type is widely used in the nMOSFET and the buried channel type in the pMOSFET. Source/drain diffusion layers 1, 2 and a channel region of these transistors are formed by an ion implantation of impurities or a diffusion from a solid phase containing these impurities, and the n type diffusion layer contains phosphorus or arsenic as impurities, and the p type diffusion layer has boron or boron fluoride.

As the MOSFETs are becoming finer, a gate electrode 4 and the source/drain diffusion layers 1, 2 are also reduced in size, as a result of the reduction of their sectional area, the gate resistance and the diffusion resistance of the source/drain diffusion layers increase.

Against such an increase of those resistances, it has been attempted to lower the resistances by using a metal such as titanium, tungsten, cobalt and nickel, and forming compounds of the metal with a semiconductor (a silicon, etc.) in the gate electrode and the source/drain diffusion layers (to form silicides or salicides). At this time, in the case of a dual gate CMOS in which an n type gate and a p type gate differing in polarity are mutually connected, it is necessary to form silicides or salicides so as not to form a pn diode.

As the micronization is further promoted, lately, and the gate length and the like become much shorter, when a reducing metal is used such as titanium and tungsten, a silicide layer of high resistance in a metastable state is formed by the salicide forming mechanism depending on the gate length, and a silicide layer or a salicide layer of low resistance in a stable state cannot be formed.

It is hence required to form a silicide by using a non-reducing metal such as cobalt and nickel as diffusion seeds, which may realize silicide layers or salicide layers of low resistance.

When cobalt or nickel is used, however, the following problems are encountered.

A first problem is derived from the nature of diffusion seeds such as cobalt and nickel. That is, these metals are large in mobility contrary to titanium or tungsten, and they serve themselves as diffusion seeds, and form silicide layers. Accordingly, in the peripheral area of the silicide layer, the metal supply is decreased, and the film thickness of the silicide layer is smaller than that of the central area of the silicide layer. By contrast, in the central area of the silicide layer, cobalt or the like is supplied more than in the peripheral area, and the silicide forming reaction is promoted, the silicide layer becomes thicker, which may even exceed the thickness of the source/drain diffusion layers (for example, 0.1 μm thick).

Figure 20:
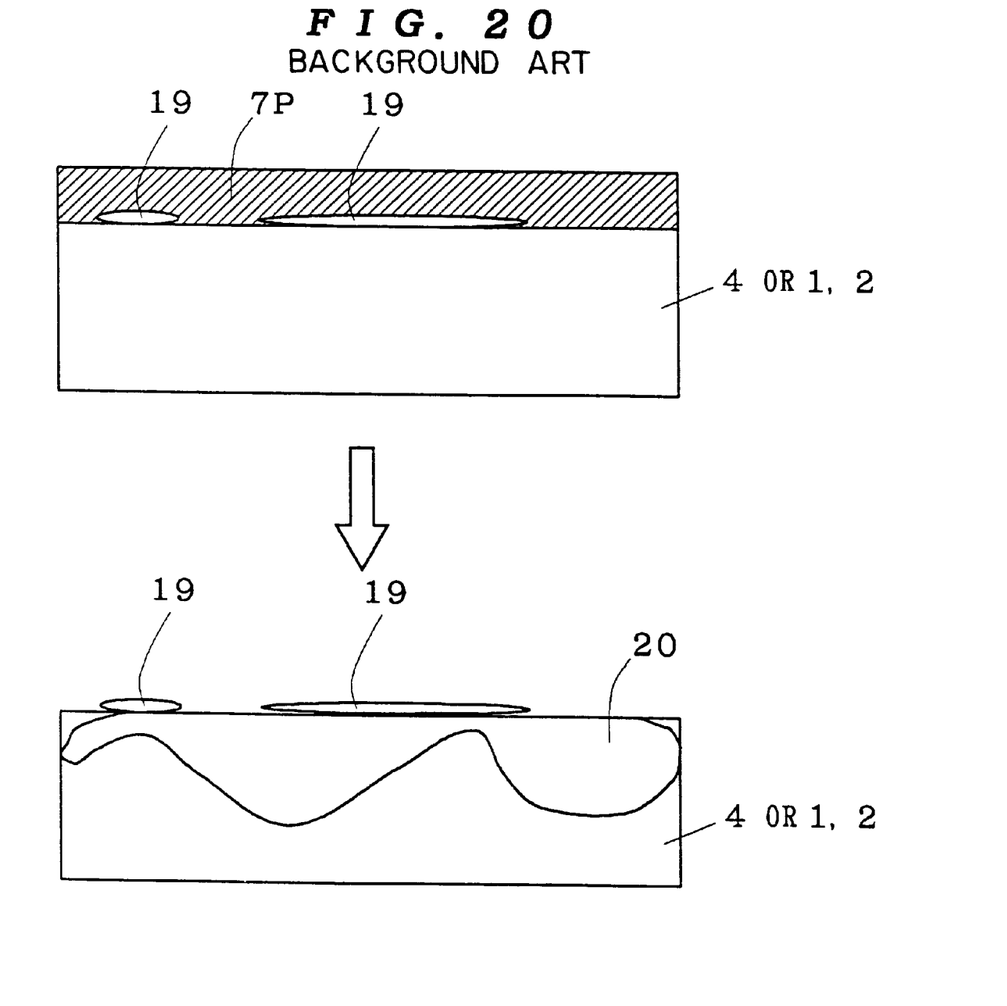
FIG. 20 is a diagram indicating problems in the prior art.

A second problem is derived from the non-reducing property of cobalt or nickel. Unlike titanium, these metals have no reducing action, and therefore if a natural oxide film is present on the surface of the gate electrode or the source/drain diffusion regions, the silicide forming is suppressed in the area, and the silicide forming reaction is promoted unevenly. As a result, as shown in FIG. 20, the flatness of the silicide layer 20 is poor, and the surface irregularity becomes large, and therefore the electric field becomes intense in the thick portion of the silicide layer 20, the interlayer is broken in the portion, and a leak current occurs. If the value of individual leak currents may be small, their sum may be too large to be ignored. In FIG. 20, meanwhile, the reference numeral 7P indicates a cobalt layer.

Thus, when forming a silicide by using a non-reducing metal such as cobalt and nickel, the presence of the natural oxide film or the like causes a junction leak. In the case of using a reducing metal such as titanium, on the other hand, oxygen is emitted outside by the reducing action in the silicide forming reaction, and the problem of the junction leak does not occur.

SUMMARY OF THE INVENTION

A first aspect of the present invention relates to a semiconductor device comprising a semiconductor substrate of a first conductive type, an insulating film formed on a principal surface of the semiconductor substrate, an electrode layer formed on an upper surface of the insulating film, a silicide layer formed on an upper surface of the electrode layer, and an impurity layer distributed inside the silicide layer and distributed also from an interface of the silicide layer and the electrode layer toward inside the electrode layer, wherein the electrode layer and the silicide layer form a gate electrode of a transistor, the silicide layer corresponds to a layer of a metal as non-reducing diffusion seed formed as suicide, and the impurity layer consists essentially of a material not spoiling the electric characteristic of the transistor.

A second aspect of the present invention relates to a semiconductor device of the first aspect, further comprising a diffusion layer of a second conductive type of the transistor formed toward an inside of the semiconductor substrate from part of a portion forming an interface with the insulating film and other part than the portion forming the interface with the insulating film, in the principal surface of the semiconductor substrate, a new silicide layer formed toward inside the diffusion layer from the principal surface of the semiconductor substrate being other than the portion forming the interface with the insulating film, and a new impurity layer distributed inside the new silicide layer, and also distributed toward inside the diffusion layer from an interface of the new silicide layer and the diffusion layer, wherein the new impurity layer consists essentially of a same material as the impurity layer.

A third aspect of the present invention relates to a semiconductor device of the second aspect, wherein the impurity layer and the new impurity layer consist essentially of a material smaller in activation energy than impurity ions injected in the diffusion layer.

A fourth aspect of the present invention relates to a semiconductor device of the third aspect, wherein the impurity layer and the new impurity layer consist essentially of nitrogen.

A fifth aspect of the present invention relates to a semiconductor device of the fourth aspect, wherein. the impurity layer and the new impurity layer comprise nitrogens produced when injecting a same element as the semiconductor substrate, and the distribution density of the nitrogens produced when injecting the element ranges from $1E16/cm^3$ to $1E20/cm^3$.

A sixth aspect of the present invention relates to a semiconductor device of the third aspect, wherein the impurity layer and the new impurity layer consist essentially of fluorine.

A seventh aspect of the present invention relates to a manufacturing method of a semiconductor device comprising a step of forming a transistor on and in a principal surface of a semiconductor substrate of a first conductive type, the transistor comprising a gate oxide film, a gate electrode, and source/drain diffusion layers of a second conductive type, a step of depositing a metal as a non-reducing diffusion seed on respective upper surfaces of the gate electrode and the source/drain diffusion layers to form a metal layer, a step of injecting a mixing material from the metal layer toward an inside of the source/drain diffusion layers and an inside of the gate electrode by an ion implantation, the mixing material having a property not spoiling the electric characteristic of the transistor, and a step of forming the metal layer after the injection into a silicide to form silicide layers in the gate electrode and the source/drain diffusion layers.

An eighth aspect of the present invention relates to a manufacturing method of a semiconductor device of the seventh aspect, wherein the mixing material consists essentially of a material having a smaller activation energy than an ion injected when forming the source/drain diffusion layers.

A ninth aspect of the present invention relates to a manufacturing method of a semiconductor device of the seventh aspect, wherein the mixing material consists essentially of nitrogen.

A tenth aspect of the present invention relates to a manufacturing method of a semiconductor device of the seventh aspect, wherein the mixing material consists essentially of fluorine.

An eleventh aspect of the present invention relates to a manufacturing method of a semiconductor device of the seventh aspect, wherein the mixing material comprises an element for composing the semiconductor substrate.

A twelfth aspect of the present invention relates to a manufacturing method of a semiconductor device of the seventh aspect, wherein the mixing material consists essentially of an element for composing the semiconductor substrate, and an element smaller in activation energy than an ion injected when forming the source/drain diffusion layers.

A thirteenth aspect of the present invention relates to a field effect transistor comprising a semiconductor substrate of a first conductive type, a gate oxide film formed on a principal surface of the semiconductor substrate, a gate electrode formed on an upper surface of the gate oxide film, source/drain diffusion layers of a second conductive type formed by injecting ions in the principal surface of the semiconductor substrate, a silicide layer of a metal as a non-reducing diffusion seed formed in the gate electrode, an other silicide layer of a metal as the non-reducing diffusion seed formed in the source/drain diffusion layers, an impurity layer distributed inside the silicide layer and the gate electrode free from the suicide layer, the impurity layer consisting essentially of an element smaller in activation energy than the ion, and an other impurity layer distributed inside the other silicide layer and the source/drain diffusion layers free from the other silicide layer, the other impurity layer consisting essentially of the element.

A fourteenth aspect of the present invention relates to a field effect transistor comprising a silicon substrate of a first conductive type, a gate oxide film formed on a principal surface of the silicon substrate, a gate electrode formed on an upper surface of the gate oxide film, source/drain diffusion layers of second conductive type formed by injecting ions into the principal surface of the silicon substrate, a silicide layer of a metal as a non-reducing diffusion seed formed in the gate electrode, an other silicide layer of a metal as the non-reducing diffusion seed formed in the source/drain diffusion layers, a nitrogen layer distributed inside the silicide layer and the gate electrode free from the silicide layer, the nitrogen layer having a density in a range from $1E16/cm^3$ to $1E20/cm^3$, and an other nitrogen layer distributed inside the other silicide layer and the source/drain diffusion layers free from the other silicide layer, the other nitrogen layer having a density in a range from $1E16/cm^3$ to $1E20/cm^3$.

According to the first aspect of the present invention, the impurity layer destroys, when it is distributed, a natural oxide film which may exist in the interface of the silicide metal and the gate electrode, so that the silicide layer is formed without being affected by the natural oxide film. Therefore, the silicide layer of uniform film thickness and excellent flatness is formed. Hence, it is easy to control the resistance of the silicide layer.

According to the second aspect of the present invention, the new impurity layer destroys, when it is distributed, a natural oxide film which may exist in the interface of the silicide metal and the gate electrode, so that the new silicide layer is formed without being affected by the natural oxide film. Therefore, the silicide layer of uniform film thickness and excellent flatness is formed without penetrating through the diffusion layer. Hence, it is easy to control the resistance of the suicide layer. Moreover, when a voltage is applied to the diffusion layer, the gradient of the line of electric force is gentle, and the junction leak decreases.

According to the third aspect of the present invention, the material smaller in activation energy than the impurity ion in the diffusion layer destroys, when it is distributed. natural oxide films which may exist in the interface of the silicide metal and the gate electrode and the interface of the silicide metal and the diffusion layer.

According to the fourth aspect of the present invention, the nitrogen destroys, when it is distributed, natural oxide films which may exist in the interface of the silicide metal and gate electrode and the interface of the silicide metal and diffusion layer.

According to the fifth aspect of the present invention, the nitrogens distribute when injecting the same element as the semiconductor substrate. The element destroys, when it is distributed, natural oxide films which may exist in the interface of the silicide metal and the gate electrode and the interface of the silicide metal and the diffusion layer, and also contributes itself to the formation of the silicide layer and the new silicide layer.

According to the sixth aspect of the present invention, the fluorine destroys, when it is distributed, natural oxide films which may exist in the interface of the silicide metal and the gate electrode and the interface of the silicide metal and the diffusion layer.

According to the seventh aspect of the present invention, after the step of forming the metal layer, natural oxide films exist unevenly in the interface of the metal layer and the gate electrode and the interface of the metal layer and the source/drain diffusion layers. By injecting the mixing material toward an inside of the gate electrode and an inside of the source/drain diffusion layers through the metal layer, the mixing material destroys the natural oxide films, reaches up to the inside of the gate electrode and the inside of the source/drain diffusion layers, and forms a distribution of specific density.

Afterwards, the metal layer undergoes the silicide forming reaction. At this time, there is no natural oxide film which is not favorable for the silicide forming reaction using the non-reducing diffusion seed metal, and hence the silicide forming reaction progresses uniformly in the interface region of the metal layer and the gate electrode and the interface region of the metal layer and the source/drain diffusion layers, and a flat silicide layer is formed inside the gate electrode and inside the source/drain diffusion layers. At this time, the mixing material distributes inside both the gate electrode and the source/drain diffusion layers, but it does not affect the silicide forming reaction because it has the nature not spoiling the electric characteristic of the transistor. Therefore, after forming the silicide layer, the mixing material distributes over the inside of the gate electrode including the silicide layer, and the mixing material also distributes over the inside of the source/drain diffusion layers including the silicide layer.

According to the eighth aspect of the present invention, although the mixing material distributes inside the source/drain diffusion layers, its activation energy is smaller than that of the ion for forming the source/drain diffusion layers, and therefore the mixing material does not have adverse effects on the characteristics of the source/drain diffusion layers.

According to the ninth aspect of the present invention, the nitrogen destroys, when it is injected, natural oxide films which exists in the interface of the metal layer and the gate electrode and the interface of the metal layer and the source/drain diffusion layers.

According to the tenth aspect of the present invention, the fluorine destroys, when it is injected, natural oxide films which exists in the interface of the metal layer and the gate electrode and the interface of the metal layer and the source/drain diffusion layers.

According to the eleventh aspect of the present invention, the mixing material destroys, when it is injected, natural oxide films which exists in the interface of the metal layer and the gate electrode and the interface of the metal layer and the source/drain diffusion layers. At this time, the nitrogen distributes in the gate electrode and the source/drain diffusion layers at a density ranging from $1E16/cm^3$ to $1E20/cm^3$. After the injection, since the mixing material is same as the element of the semiconductor substrate, and it induces the silicide forming reaction itself with the metal layer, but since the density of the element itself composing the semiconductor substrate is increased by the injection of the mixing material containing the same element as the semiconductor substrate, the silicide forming reaction is promoted in the interface region of the metal layer before the silicide forming reaction and the principal surface of the semiconductor substrate. The nitrogen injected along with the mixing material does not contribute to the silicide forming reaction, and therefore after forming the silicide layer, only the nitrogen distributes as the material injected from outside into the gate electrode and the source/drain diffusion layers.

According to the twelfth aspect of the present invention, the mixing material destroys, when it is injected, natural oxide films which exists in the interface of the metal layer and the gate electrode and the interface of the metal layer and the source/drain diffusion layers. Of the mixing material, the same element as the semiconductor substrate contributes to the silicide forming reaction after the injection, and in the gate electrode and the source/drain diffusion layers after forming the silicide layer, the ions of smaller activation energy than the ions for forming the source/drain diffusion layers, and the nitrogens having the density ranging from $1E16/cm^3$ to $1E20/cm^3$ distribute. Incidentally, in the relation with the crystal defects which may exist in the principal surface of the semiconductor substrate, the crystal defect trap part of the mixing materials smaller in the activation energy than the ions for forming the source/drain diffusion layers.

According to the thirteenth aspect of the present invention, the impurity layer and the other impurity layer destroy, when they are distributed, natural oxide films which exists in the interface of the metal layer and the gate electrode and the interface of the metal layer and the source/drain diffusion layers, and therefore the silicide layer and the other silicide layer of uniform film thickness and excellent flatness are formed. It is hence easier to control the resistance of the silicide layer and the other silicide layer. Moreover, when a voltage is applied to the source/drain diffusion layers, the gradient of the line of electric force is gentle, and the junction leak decreases.

According to the fourteenth aspect of the present invention, that the density of the impurity layer and the other impurity layer is in a range of $1E16/cm^3$ to $1E20/cm^3$ means that they are formed when a silicon is preliminarily injected into he silicon substrate. When injecting the silicon, the silicon destroys natural oxide films which exists in the interface of the metal layer and the gate electrode and the interface of the metal layer and the source/drain diffusion layers, and moreover since the silicon is the same element as the silicon substrate, the silicide forming reaction is induced to form the silicide layer and the other silicide layer. Accordingly, the silicide layer and the other silicide layer free from sinking, uniform in film thickness, and excellent in flatness are formed. It is hence easier to control the resistance of the silicide layer and the other silicide layer. Moreover, when a voltage is applied to the source/drain diffusion layers, the gradient of the line of electric force is gentle, and the junction leak decreases.

The first aspect of the present invention achieves a semiconductor device having a silicide layer, excellent in flatness and uniform in film thickness, inside a gate electrode.

The second aspect of the present invention, along with the effect of the first aspect of the present invention, achieves a semiconductor device having a new silicide layer, excellent in flatness and uniform in film thickness, inside source/drain diffusion layers, and enabling to fully prevent a junction leak occured in the source/drain diffusion layers.

The third aspect of the present invention achieves a semicondcutor device having the same effect of the second aspect of the present invention by applying a material used for general purpose on a conventional semiconductor process.

The fourth aspect of the present invention achieves a semiconducgtor device having the same effect of the second aspect of the present invention by applying a material for general purpose especially such as nitrogen.

The fifth aspect of the present invention achieves a semiconductor device having a silicide layer and a new silicide layer, which are excellent in flatness, far from sinking and uniform in film thickness, and enabling to fully prevent a junction leak occured in source/drain diffusion layers.

The sixth aspect of the present invention achieves a semiconducgtor device having the same effect of the second aspect of the present invention by applying a material for general purpose especially such as fluorine.

According to the seventh aspect of the present invention, a silicide layer excellent in flatness without irregularity enables to eliminate causes of a junction leak in source/drain diffusion layers laid as a conventional problem, so that characteristics of the junction leak are improved.

Moreover, according to the seventh aspect of the present invention, an even promotion of a silicide forming reaction enables to form a silisice layer, uniform in film thickness and excellent in flatness, inside a gate electrode and the source/drain diffusion layers by preventing the silicide layer to be thinner in film thickness in regions around the silicide layer. Besides, the achievement of the film flatness and the uniformity in film thickness all over the silicide layers leads to an easy control of a silicide resistance.

In addition, according to the seventh aspect of the present invention, the silicide layer is uniformed in film thickness as the suicide forming reaction is promoted evenly. This effectively prevents the silicide layer to be formed deep inside a semiconductor substrsate over the source/drain diffusion layers.

In the eighth aspect of the present invention, a manufacturing method of a semiconductor device has the same effect of the seventh aspect of the present invention, and further includes the following effect. In the present invention, a manufacturing method of a semiconductor device applies a mixing material having a smaller activation energy than impurity ions forming source/drain diffusion layers. That is, the present invention can apply the same mixing materials such as nitrogen or fluorine and the like used for other purposes on a conventional semiconductor process.

The ninth aspect of the present invention includes the same effect of the eighth aspect of the present invention by applying a general material especially such as nitrogen as a mixing material.

The tenth aspect of the present invention accomplishes the same effect of the eighth aspect of the present invention by applying a general material especially such as fluorine as a mixing material.

According to the eleventh aspect of the present invention, along with the same effect of the seventh aspect of the present invention, a sinking of a silicide layer often caused especially by a silicide formation reaction can be prevented.

According to the twelfth aspect of the present invention, along with the same effect of the seventh aspect of the present invention, a sinking of a silicide layer often caused by a silicide formation reaction can also be prevented.

Moreover, according to the twelfth aspect of the present invention, instead of an electron, an element having a smaller activation energy than impurity ions in source/drain diffusion layers can be trapped in crystal defects existed on a principal surface of a semiconductor substrate, so that the reliability of the semiconductor substrate is enhanced while the neutrality of the semiconductor substrate is maintained.

The thirteenth aspect of the present invention achieves a field effect transistor having a silicide layer and another silicide layer excellent in flatness and uniform in film thickness, and enabling to fully prevent a junction leak occured in source/drain diffusion layers.

The fourteenth aspect of the present invention achieves a field effect transistor having a silicide layer and another silicide layer excellent in flatness, far from sinking and uniform in film thickness, and enabling to fully prevent a junction leak occured in source/drain diffusion layers.

It is therefore an object of the present invention to solve the conventional problems and realize the structure of a semiconductor device or a field effect transistor having a silicide layer which is uniform in film thickness and excellent in flatness and of which junction leak characteristic is improved, and its manufacturing method.

It is other object of the invention to prevent a sinking phenomenon when forming a silicide layer, which may generally occur when using a diffusion seed metal such as cobalt and nickel.

These and other objects, features, aspects and advantages of the present invention will become more apparent from the following description of the present invention when taken in conjunction with the accompanying drawings.

DESCRIPTION OF THE PREFERRED EMBODIMENTS

Referring now to the drawings, some of the preferred embodiments of the present invention are described in detail below. The parts corresponding to the description of the prior art are not specifically described to avoid duplication. As the micronization is advanced in the future, the forming conditions described below such as impurity ion concentration will naturally vary according to the general rule of proportional reduction.

Herein, as the silicide forming metal, cobalt being a non-reducing diffusion seed, is used, but the invention may be similarly applied by using nickel being, another non-reducing diffusion seed. The "reduction" or the "reducing action" refers herein to the nature or the action of the metal, as defined according to the preferred embodiments described below, that is capable of emitting the oxygen atoms to outside when forming a silicide layer or a salicide layer by compounding between the silicon or the other constituent elements of a semiconductor substrate and the silicide forming metal.

In the detailed description, the MOS field effect transistor of surface channel type is described, but the invention may be also applied in the MOS field effect transistor of buried channel type. The MOS field effect transistor is also described briefly as a field effect transistor or a transistor.

Seeing that the term "silicide layer" is used in a wide sense of meaning, the term "silicide layer" is used herein in the meaning including "salicide layer."

(First Preferred Embodiment)

Figure 1:
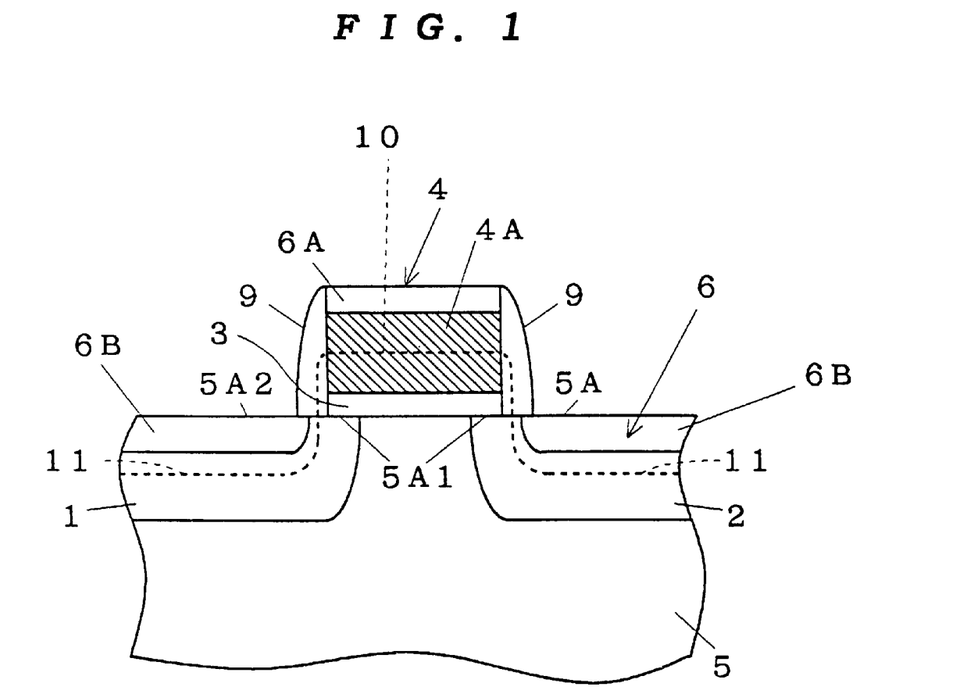
FIG. 1 is a sectional view showing a structure of a semiconductor device or a FET obtained in the preferred embodiment 1.

FIG. 1 shows a sectional structure of a surface channel type MOSFET which is a semiconductor device obtained in a first preferred embodiment of the invention.

In the diagram the reference numeral 1 denotes a source diffusion layer of the second conductive type, and the reference numeral 2 denotes a drain diffusion layer of the second conductive type. Hereinafter, both the reference numerals 1 and 2 are collectively called the source/drain diffusion layers of the second conductive type which means that the one diffusion layer is a source while the other diffusion layer a drain, or the diffusion layers. The reference numeral 3 denotes a gate insulating film of $SiO_2$ film or the like, the reference numeral 4A denotes an electrode layer of a polysilicon or the like, the reference numeral 6A denotes a silicide layer formed inside the electrode layer 4A, and the electrode layer 4A and the silicide layer 6A form a gate electrode 4 of this transistor. The reference numeral 9 denotes a side wall composed of an insulating film.

On the other hand, the reference numeral 5 denotes a semiconductor substrate of the first conductive type, which is a silicon substrate in this embodiment. The silicide layers 6B (corresponding to a new silicide layer or an other silicide layer) are formed inside the diffusion layers 1, 2 formed toward the inside of the semiconductor substrate 5 from a part 5A1 forming the peripheral portion of the interface with the gate insulating film 3 and a part 5A2 other than the portion forming the interface with the gate insulating film 3 in a principle surface 5A of the semiconductor substrate 5. The both silicide layers 6A, 6B may be collectively called silicide layers 6.

Moreover, inside the silicide layer 6A and in the region of a specific depth spreading from the interface of the silicide layer 6A and the electrode layer 4A toward the inside of the electrode layer 4A, a nitrogen layer 10 is distributed as an impurity layer. Similarly, the inside of the silicide layer 6B and in a region of a specific depth spreading from the interface of the silicide layer 6B and the diffusion layers 1 and 2 toward the inside of the diffusion layers 1 and 2, a nitrogen layer 11 is distributing as an impurity layer (corresponding to a new impurity layer).

The process flow for manufacturing the semiconductor device in FIG. 1 is described below by referring to the following diagrams.

Figure 2:
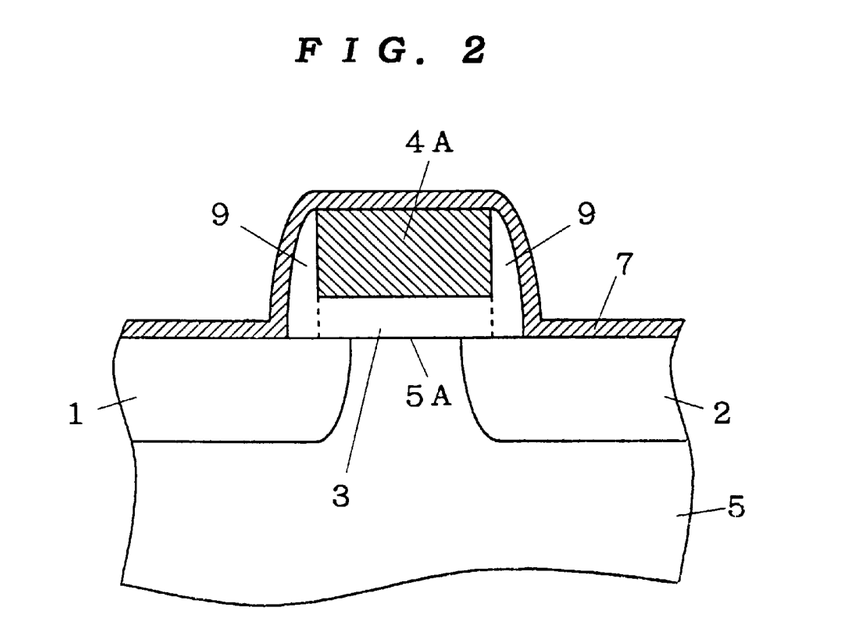
FIGS. 2, 3 and 4 are sectional views showing the manufacturing process in the preferred embodiment 1.

First, after forming element separating regions (not shown) in the same manner as in the conventional art, a transistor is formed in the conventional method (FIG. 2). That is, on the principal surface 5A side of the semiconductor substrate 5, impurity ions (boron, phosphorus, arsenic, etc.) which is determined whether the second conductive type is n type or p type are injected to form the source/drain diffusion layers 1, 2, and the gate insulating film 3 and the electrode layer 4A consisted of polysilicon are sequentially formed on the principal surface 5A. At this time, the side walls 9 are formed.

Afterwards, by the vapor deposition method, cobalts are deposited on the respective upper surfaces of the source/drain diffusion layers 1, 2, side walls 9, and the electrode layer 4A in a thickness of 20 nm or less, and a cobalt layer 7 is formed.

Figure 3:
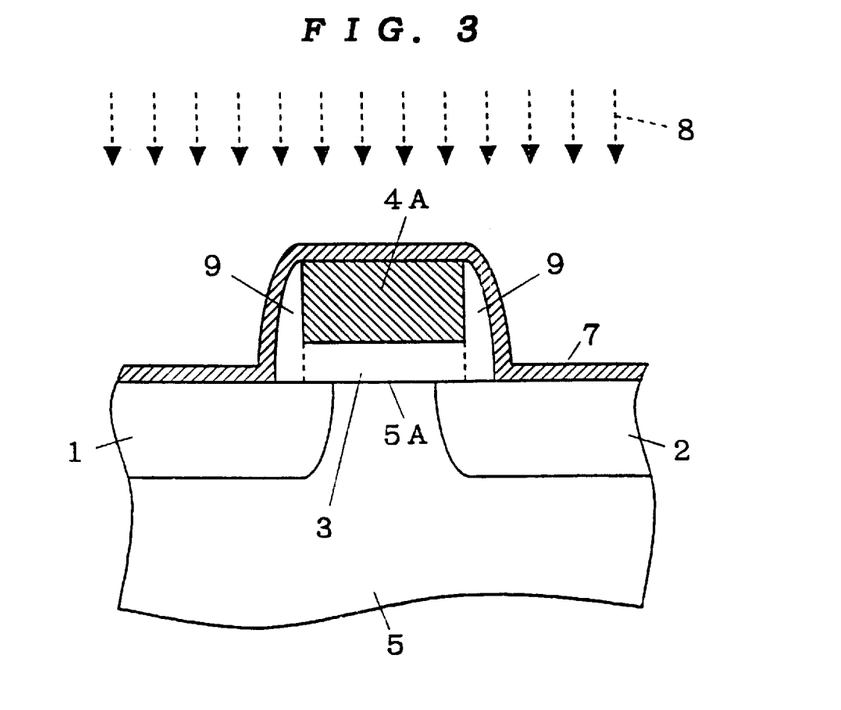

Nextly, by the ion implantation, the nitrogen 8 is injected with a density of about $1.0E15/cm^2$ as the mixing material having a property not spoiling the electric characteristic of the transistor (FIG. 3). Since the film thickness of the cobalt layer 7 is very thin, 20 nm or less, the injection energy of the nitrogen 8 is required to be only about 10 keV or more for the destruction of the natural oxide film. Still more, since the injection density of the nitrogen 8 is relatively large, in the order of about $10^{15}$, the nitrogens 8, by this injection, completely destroy the natural oxide film existing unevenly in the interface of the metal layer 4A and the cobalt layer 7, and the interface of the source/drain regions 1, 2 and the cobalt layer 7.

Incidentally, the density of silicon atoms is about $1.0E17/cm^2$ when converted to the density at the time of the injection, and if the injection density of the nitrogen 8 is increased to the level of the density of silicon atoms, the injected nitrogens may destroy the silicon layer itself in the silicon substrate, which is not preferred, and if the injection density is set around $1.0E16/cm^2$, too, since the nitrogen itself is inert, it may work to suppress the diffusion of impurity ions of boron or the like, and which is not preferred, too, and therefore the nitrogen 8 cannot be injected massively. Considering these points, the injection density of about $1.0E15/cm^2$ seems to be an appropriate injection density of the nitrogen 8.

Figure 4:
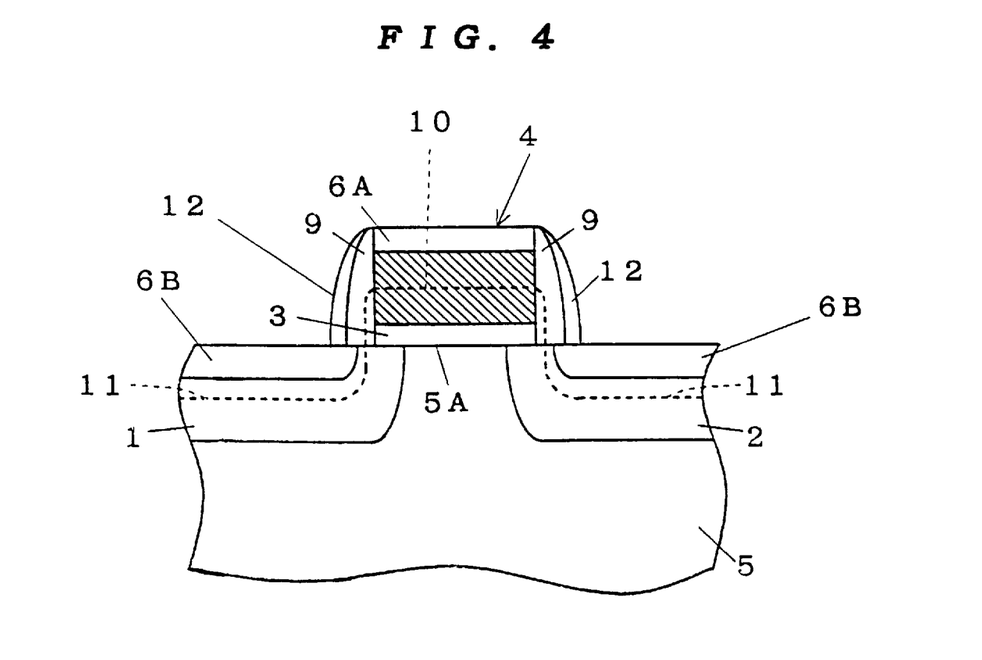

Then, by heat treatment, cobalts undergo the silicide forming reaction, and a silicide layer 6 is formed. At this time, the thickness of the silicide layer 6 is about 100 nm (FIG. 4).

Next, unreacted cobalts 12 are removed by the wet etching, and electrodes are wired same as in the conventional art.

Figure 5:
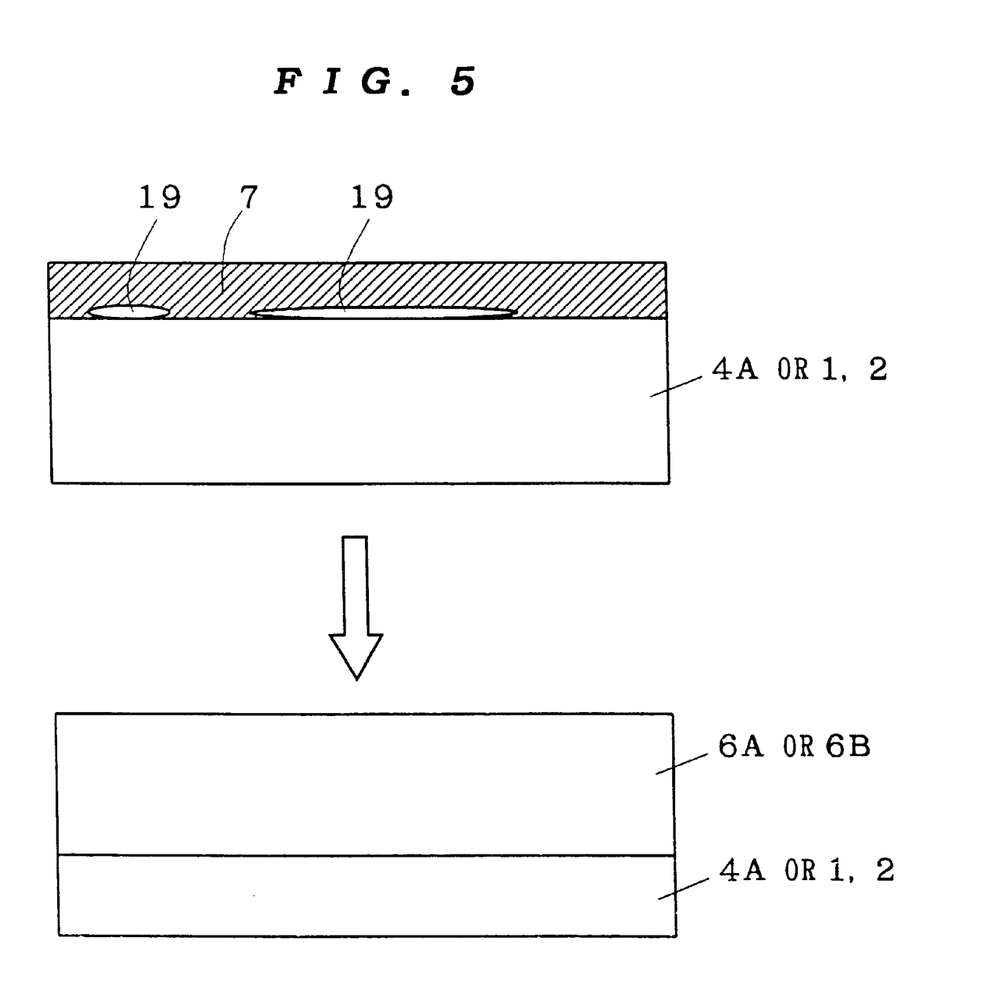
FIG. 5 is a sectional view showing the effect in the preferred embodiment 1.
Figure 6:
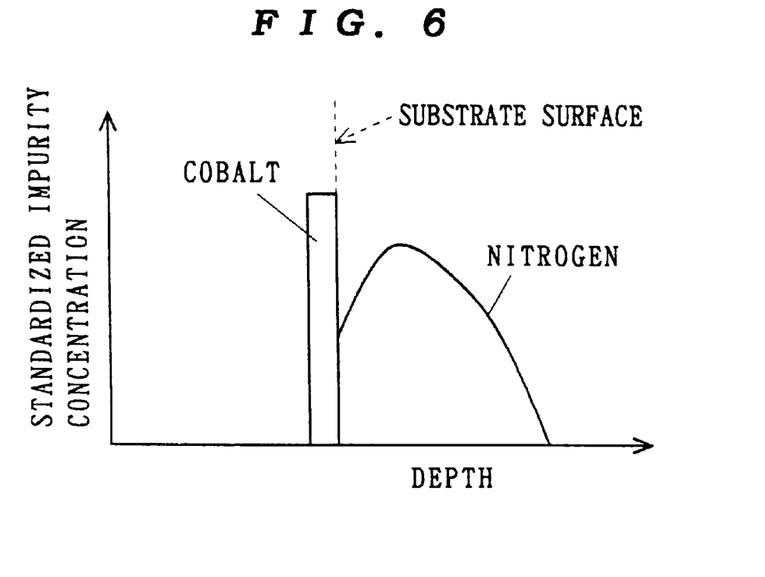
FIG. 6 is a diagram showing a distribution of impurities in the depth direction of the silicide layer before the silicide forming reaction.
Figure 7:
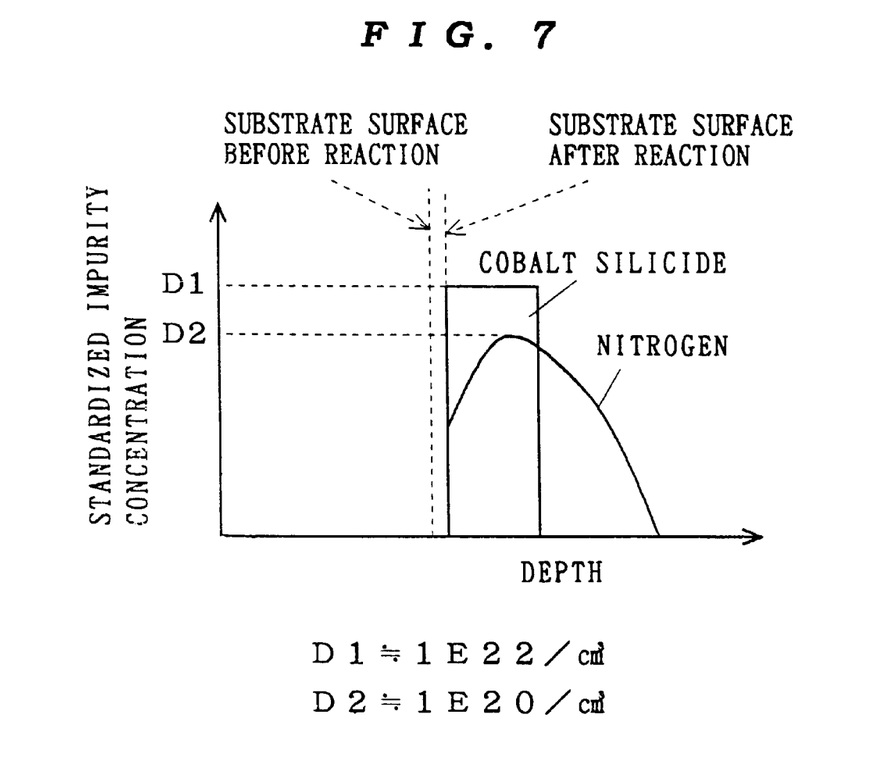
FIG. 7 is a diagram showing a distribution of impurities in the depth direction of the silicide layer after the silicide forming reaction.

As stated above, in the first preferred embodiment, at the time of the injection of the nitrogen 8, the natural oxide films unevenly existing on the interface of the cobalt layer 7 and the principal surface 5A of the semiconductor substrate 5 and the like are destroyed. As a result, the silicide forming reaction is uniformly promoted in the interface region, and the suicide layer 6 uniform in the film thickness and excellent in flatness on the whole is formed inside the metal layer 4A of the surface side and inside the source/drain diffusion layers 1, 2 of the surface side (FIG. 5). At this time, the distribution of the nitrogen layers 10, 11 as impurity layers in the depth direction in the gate electrode 4 and the source/drain diffusion layers 1, 2 becomes as shown in FIG. 6 and FIG. 7 before and after the suicide forming process, respectively. After the silicide forming reaction, as shown in FIG. 7, the principal surface or the surface 5A of the semiconductor 5 is slightly moved downward as compared with the position before the silicide forming reaction, and the sinking phenomenon of the silicide layer 6 takes place.

Meanwhile, as shown in FIG. 7, the density of the cobalt silicide is D1 ($1E22/cm^3$) close to the distribution density of silicon atoms, and the maximum distribution density of the nitrogen layer after the silicide forming reaction is D2 close to $1E20/cm^3$.

In this way, the flatness of the silicide layer 6 is notably improved, and the junction leak which was a problem after forming the cobalt silicide in the prior art is sufficiently suppressed, and the junction leak characteristic is improved sufficiently, while the control of the resistance of the silicide film is easier.

Besides, as the silicide forming reaction is progressed uniformly, the thinning of the film thickness in the peripheral area of the silicide layer 6 is also prevented.

(Second Preferred Embodiment)

A second preferred embodiment of the invention is described below by referring to accompanying drawings. The same parts as in the first preferred embodiment are indicated by same reference numerals.

Figure 8:
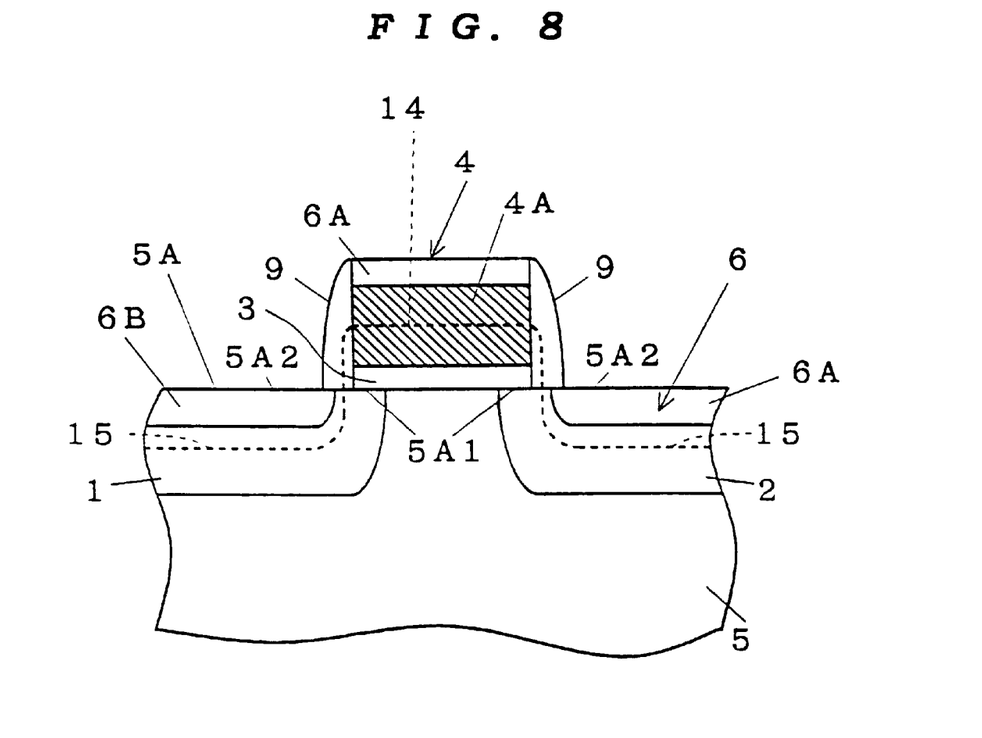
FIG. 8 is a sectional view showing a structure of a semiconductor device or a FET obtained in the preferred embodiment 2.

FIG. 8 shows a sectional structure of a surface channel type MOSFET which is a semiconductor device obtained from the second preferred embodiment of the invention. In the diagram, what differs from FIG. 1 representing the first preferred embodiment is that the impurity layers distributing in the gate electrode 4 and the source/drain diffusion layers 1, 2 are the fluorine layers 14, 15. The others are structurally same as in the first preferred embodiment. The process flow for manufacturing the transistor in FIG. 8 is described below with reference to drawings.

Figure 9:
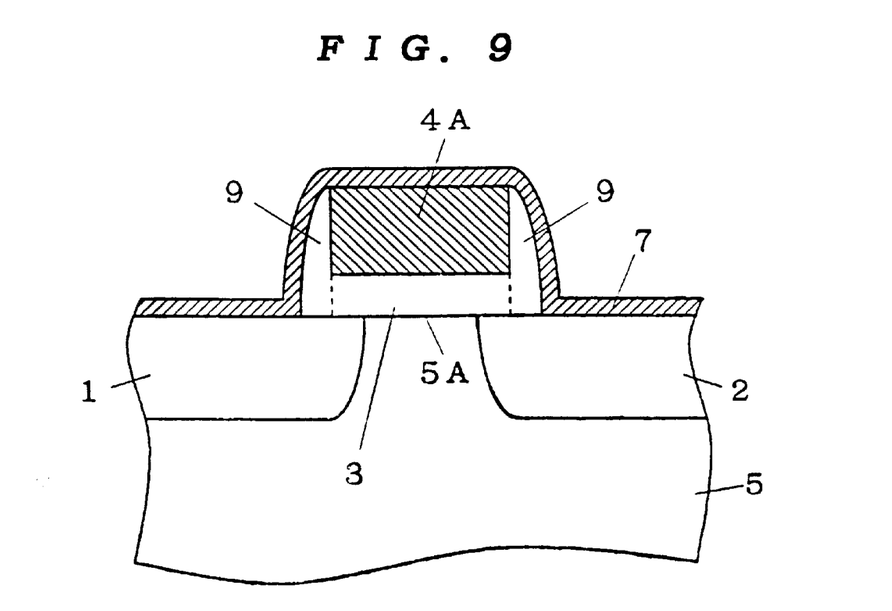
FIG. 9 is a sectional view showing the manufacturing process in the preferred embodiment 2.

First, after forming element separating regions in the same manner as in the conventional art, a transistor is formed same as in the first preferred embodiment (FIG. 9). Then, cobalts are deposited in a thickness of 20 nm or less, and a cobalt layer 7 is formed.

Figure 10:
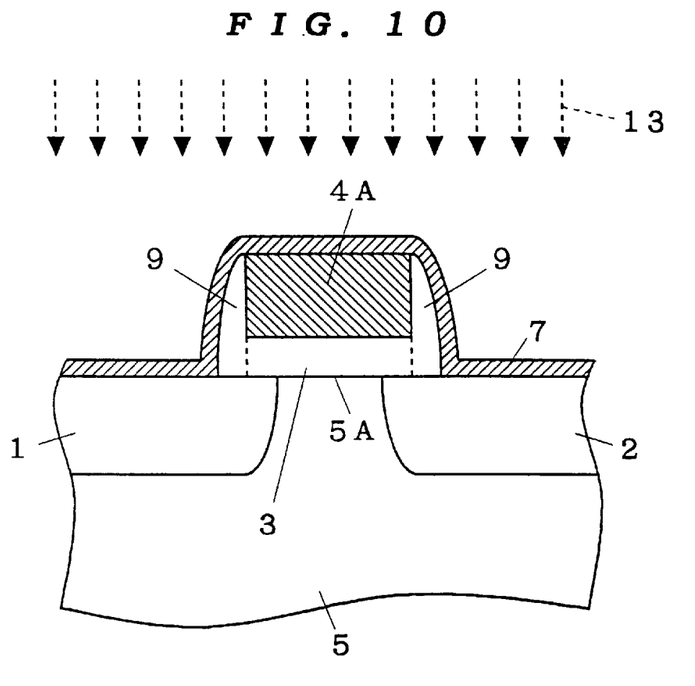
FIG. 10 is a sectional view showing the manufacturing process in the preferred embodiment 2.

By the ion implantation, consequently, the fluorines 13 are injected with a density of $1.0E15/cm^2$ as a mixing material (FIG. 10). Herein, also, since the film thickness of the cobalt layer 7 is very thin, 20 nm or less, and the required injection energy of the fluorine 13 is only 10 keV or more. At this time, same as in the first preferred embodiment, the fluorines 13 destroy the natural oxide film, and distribute inside the metal layer 4A and inside the source/drain diffusion layers 1, 2.

Later, forming a silicide layer 6 of cobalt, the unreacted cobalts are removed, and the source electrode, the gate electrode, and the drain electrode are wired, same as in the first preferred embodiment.

In this second preferred embodiment, also, the same effects as in the first preferred embodiment are obtained by the fluorine injection.

The fluorine used herein, as well as the nitrogen used in the preferred embodiment 1, is an inert mixing material of which activation energy is smaller than that of impurity ions (boron, etc.) forming the source/drain diffusion layers 1, 2, and therefore the nitrogen and the fluorine do not emit carrier after being distributed, and have no adverse effects on the transistor characteristics.

(Third Preferred Embodiment)

A third preferred embodiment of the invention is described below with reference to awings. Same parts as in the first and second preferred embodiments are identified with the same reference numerals.

Figure 11:
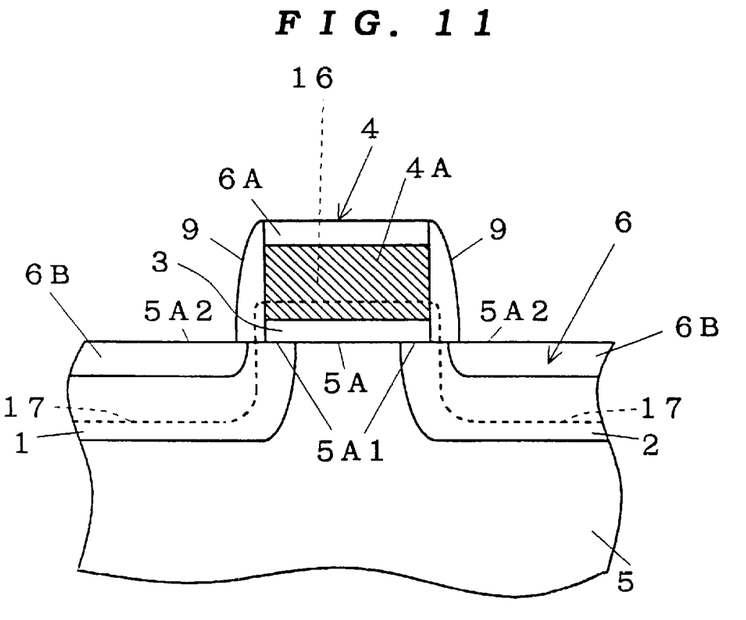
FIG. 11 is a sectional view showing a structure of a semiconductor device or a FET obtained in the preferred embodiment 3.

FIG. 11 shows a sectional structure of a surface channel type MOSFET which is a semiconductor device obtained from the third preferred embodiment of the invention. What the FET in the diagram differs from the structure of the preferred embodiment 1 is that the density of nitrogen layers 16 (impurity layer), 17 (new impurity layer) distributing in the gate electrode 4 and the source/drain diffusion layers 1, 2 ranges from $1E16/cm^3$ to $1E20/cm^3$, and that the nitrogen layers 16, 17 are distributed more deeply than in the first preferred embodiment. The process flow for manufacturing the FET in FIG. 11 is described below while referring to drawings.

Figure 12:
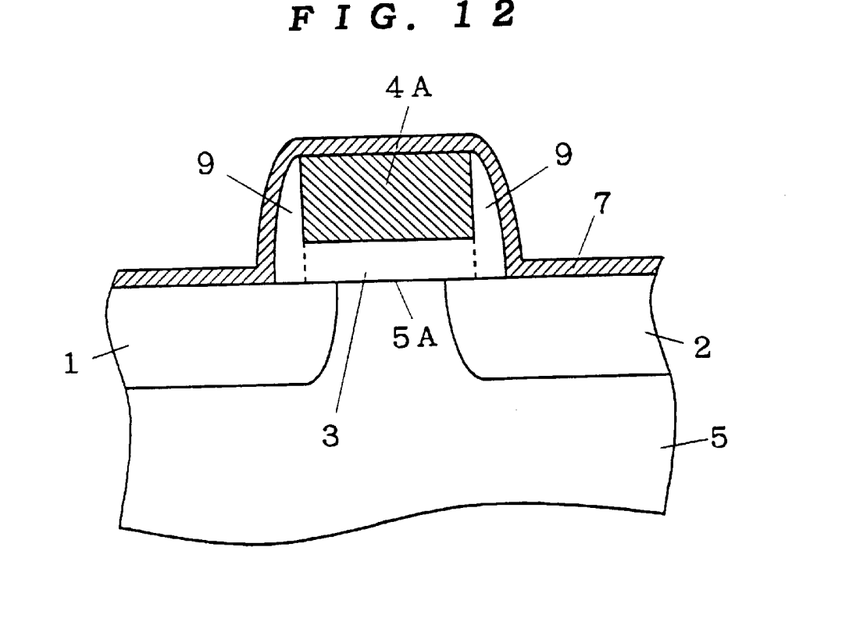
FIGS. 12, 13 and 14 are sectional views showing the manufacturing process in the preferred embodiment 3.

After forming element separating regions in the same manner as in the conventional art, a transistor is formed (FIG. 12). Further, the cobalts 7 are deposited in a thickness of 20 nm or less.

Figure 13:
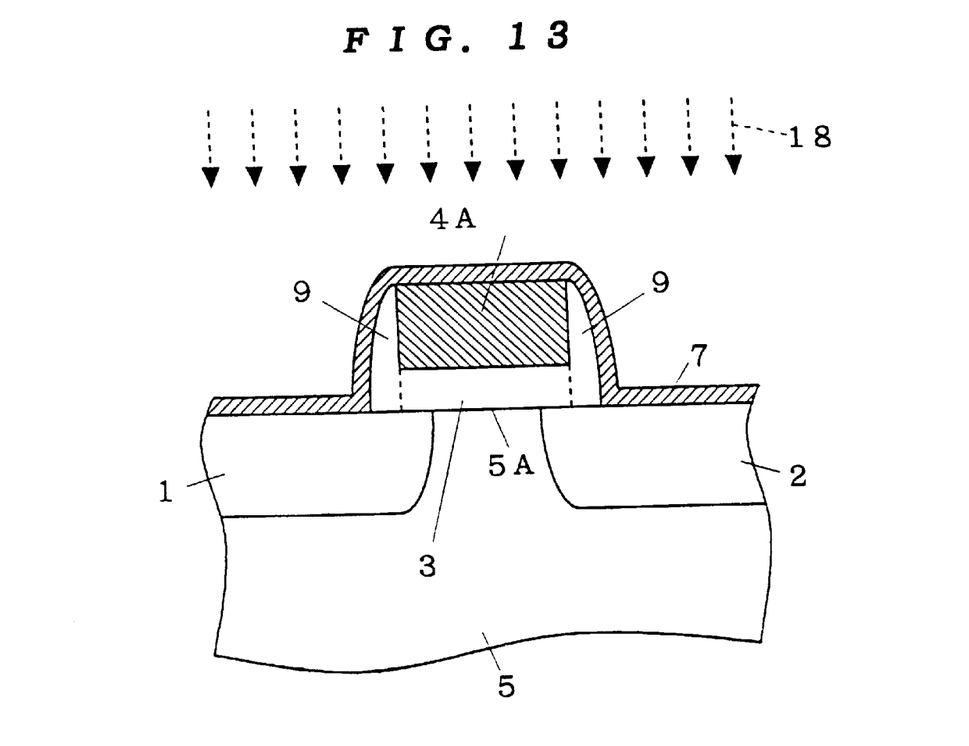

Next, by the ion implantation, the silicons 18 are injected with a density of about $1.0E15/cm^2$ (FIG. 13). Since the film thickness of the cobalt layer is very thin, 20 nm or less, the required injection energy of the silicon 18 is only 15 keV or more for destroying the natural oxide film by silicon. Herein, since the mass of silicon is heavier than that of nitrogen or fluorine, a higher energy is required for the injection energy of the silicon 18 than in the first ans second preferred embodiments. At the time of the injection of the silicon 18, nitrogens invade into the gate electrode 4 and the source/drain diffusion layers 1, 2, thereby forming the distribution of the nitrogen layers 16, 17. The distribution density of the nitrogen layers 16, 17 is as described above.

Figure 14:
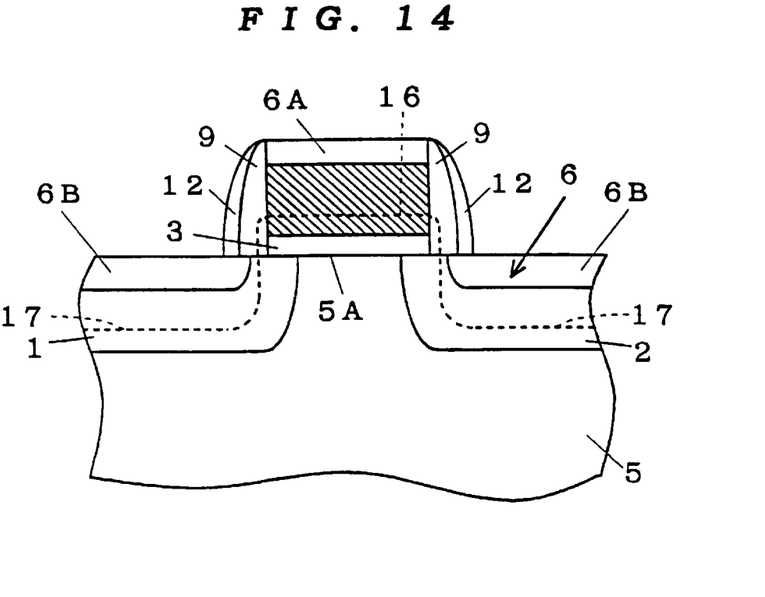

Afterwards, forming a cobalt suicide layer (FIG. 14), the unreacted cobalts 16 are removed, and wiring layers are connected same as in the conventional art.

Figure 15:
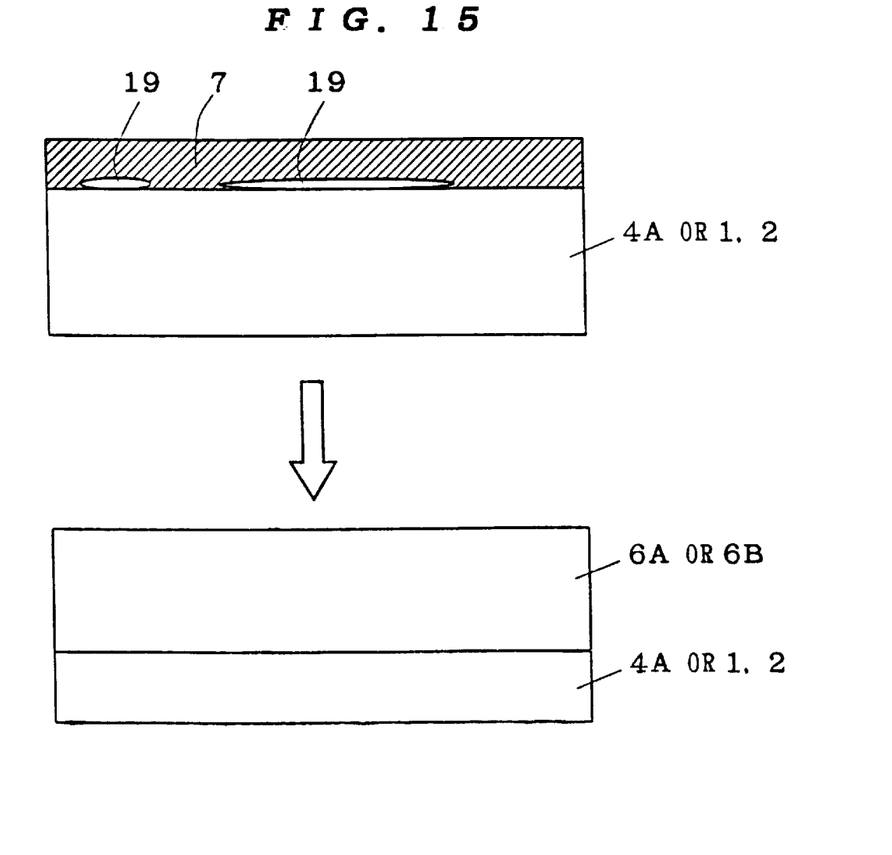
FIG. 15 is a sectional view showing the effect in the preferred embodiment 3.

In the third preferred embodiment too, by injecting the same mixing material as the element for composing the semiconductor substrate of silicon, the same effects as in the first preferred embodiment can be obtained (FIG. 15). Moreover, in this embodiment, by injecting silicon, the silicon density in the semiconductor substrate and the silicon density in the electrode layer 4A of polysilicon are increased. In particular, the injected silicon itself induces the silicide forming reaction with cobalt, and hence the silicide forming reaction is further promoted than in the first and second preferred embodiments at the interface position of the cobalt layer before the suicide forming reaction and the principal surface of the semiconductor substrate. As a result, there is no change in the position of the principal surface of the semiconductor substrate before and after the reaction, and it is effective to prevent the sinking of the silicide layer which is often observed in the silicide forming reaction using cobalt as a diffusion seed. This benefit is schematically shown in FIG. 16 (before the silicide forming reaction) and in FIG. 17 (after the silicide forming reaction).

Figure 16:
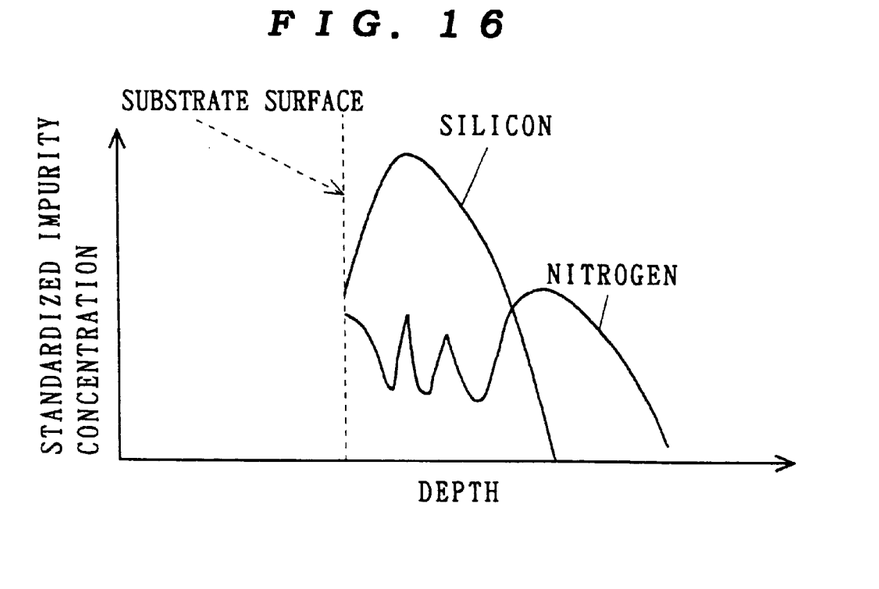
FIG. 16 is a diagram showing a distribution of impurities before the silicide forming reaction in the preferred embodiment 3.
Figure 17:
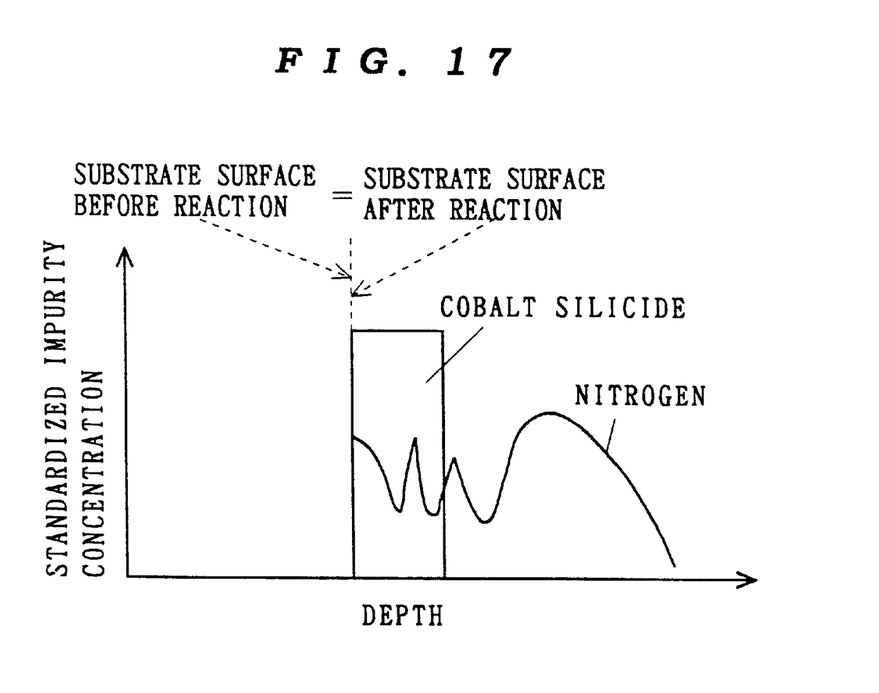
FIG. 17 is a diagram showing a distribution of the silicide layer and the nitrogen after the silicide forming reaction in the preferred embodiment 3.

Moreover, as described above, at the time of the silicon injection, nitrogens are also injected simultaneously although in a smaller quantity than the silicon injection quantity (FIGS. 16, 17). This density of nitrogen is 1E16 to $1E20/cm^3$, and the nitrogens are trapped in the crystal defects in the semiconductor substrate surface and are bonded with the crystal defects, so that the reliability of the semiconductor substrate is enhanced while the neutrality of the semiconductor substrate is maintained.

(Fourth Preferred Embodiment)

The fourth preferred embodiment of the invention is a combination of the first and second preferred embodiment and the third preferred embodiment. That is, nitrogen and silicon, or fluorine and silicone are injected as mixing materials by the ion implantation.

In the fourth first or second preferred embodiment, the same effects as in the preferred embodiment and the third preferred embodiment are obtained.

While the invention has been shown and described in detail, the foregoing description is in all aspects illustrative and not restrictive. It is therefore understood that numerous modifications and variations can be devised without departing from the scope of the invention.

We claim:

1. A manufacturing method of a semiconductor device comprising:

a step of forming a transistor on and in a principal surface of a semiconductor substrate of a first conductive type, said transistor comprising a gate oxide film, a gate electrode, and source/drain diffusion layers of a second conductive type;

a step of depositing a metal as a non-reducing diffusion seed on respective upper surfaces of said gate electrode and said source and drain diffusion layers to form a metal layer;

a step of injecting a mixing material from said metal layer toward an inside of said source/drain diffusion layers and an inside of said gate electrode by ion implantation, said mixing material having a property not spoiling the electric characteristic of said transistor; and a step of forming said metal layer after said injection into silicide to form silicide layers in said gate electrode and said source/drain diffusion layers.

2. A manufacturing method of a semiconductor device of claim 1, wherein said mixing material consists essentially of a material having a smaller activation energy than an ion injected when forming said source/drain diffusion layers.

3. manufacturing method of a semiconductor device of claim 1, wherein said mixing material consists essentially of nitrogen.

4. A manufacturing method of a semiconductor device of claim 1, wherein said mixing material consists essentially of fluorine.

5. A manufacturing method of a semiconductor device of claim 1, wherein said mixing material comprises an element for composing said semiconductor substrate.

6. A manufacturing method of a semiconductor device of claim 1, wherein said mixing material consists essentially of an element for composing said semiconductor substrate, and an element smaller in activation energy than an ioninjected when forming said source/drain diffusion layers.

* * * * *